(12) United States Patent
Kobayashi (10) Patent No.: US 8,552,357 B2
(45) Date of Patent: Oct. 8, 2013

(54) PHOTOELECTRIC CONVERSION APPARATUS

(75) Inventor: Hideo Kobayashi, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 310 days.

(21) Appl. No.: 13/040,172

(22) Filed: Mar. 3, 2011

(65) Prior Publication Data

US 2011/0215224 A1 Sep. 8, 2011

(30) Foreign Application Priority Data

Mar. 8, 2010 (JP) ................................ 2010-050767

(51) Int. Cl.
*H01J 40/14* (2006.01)
(52) U.S. Cl.
USPC ..................................................... 250/214 R
(58) Field of Classification Search
USPC .................. 250/214 R, 214 A; 348/302, 308
See application file for complete search history.

(56) References Cited

U.S. PATENT DOCUMENTS 6,300,615 B1 10/2001 Shinohara et al.
8,325,259 B2 * 12/2012 Kobayashi et al. ........... 348/302

FOREIGN PATENT DOCUMENTS

JP 2000-077644 A 3/2000

OTHER PUBLICATIONS

U.S. Appl. No. 13/104,384, filed May 10, 2011, Shinya Ishikawa.
U.S. Appl. No. 13/106,755, filed May 12, 2011, Tomohisa Kinugasa.
U.S. Appl. No. 13/090,087, filed Apr. 19, 2011, Kenji Kubozono.
U.S. Appl. No. 13/071,044, filed Mar. 24, 2011, Hiroaki Naruse.

* cited by examiner

*Primary Examiner* — Thanh Luu
(74) *Attorney, Agent, or Firm* — Canon U.S.A., Inc. IP Division (57) ABSTRACT

An apparatus includes a first photoelectric conversion element configured to convert light into a current by a photoelectric conversion, a first current amplification unit configured to amplify the current, a first current monitoring unit configured to monitor the amplified current amplified and output a monitor signal, and a first bias voltage setting unit configured to gain the monitor signal by a factor less than 1 and apply a reverse bias voltage to the first photoelectric conversion element according to the gained monitor signal.

12 Claims, 8 Drawing Sheets

PHOTOELECTRIC CONVERSION APPARATUS

BACKGROUND OF THE INVENTION

1. Field of the Invention

The present invention relates to a photoelectric conversion apparatus.

2. Description of the Related Art

In Japanese Patent Laid-Open No. 2000-77644, FIG. 1 illustrates a conventional photoelectric conversion apparatus using a phototransistor. As shown in this figure, the photoelectric conversion apparatus includes a common source circuit including a constant current source and a FIELD EFFECT TRANSISTOR driven by the constant current source. A voltage between a gate and a source of this MOSFET determines a base potential of the phototransistor. In the photoelectric conversion apparatus shown in this figure, when the amount of light incident on the base of the phototransistor changes, a corresponding change occurs in a collector current of the phototransistor, and a voltage between its base and emitter changes. This change of the voltage between the base and the emitter is mainly due to not a change in the base potential but a change in the emitter potential of the phototransistor.

However, there is a feedback loop between the emitter and the base of the phototransistor, and this feedback loop causes the base potential to have a small change. That is, when the emitter potential changes, the gate potential of the MOSFET connected to the emitter changes, and thus a change occurs in the voltage between the drain and source of the MOSFET forming the common source circuit. A constant current supplied from a constant current source flows through the MOSFET. To compensate for a change in current due to a change in drain-source voltage, the gate-source voltage changes although the change is slight. As a result, a change occurs in the base potential of the phototransistor. A PN junction including the base of the phototransistor functions as a photoelectric conversion element, and a reverse bias voltage applied to this photoelectric conversion element changes. This change in voltage occurs through charging of a parasitic capacitance associated with the base by a photocurrent. The time needed in this charging operation determines the optical response characteristic, i.e., the speed at which the current outputting from a terminal $I_{out}$ changes in response to the change in the amount of light.

In view of the above, the present invention provides a photoelectric conversion apparatus having a suppressed change in a reverse bias voltage applied to a photoelectric conversion element due to a change in the amount of light and thus having a good optical response characteristic.

SUMMARY OF THE INVENTION

According to an aspect, the present invention provides an apparatus including a first photoelectric conversion element configured to convert light into a current by a photoelectric conversion, a first current amplification unit configured to amplify the current, a first current monitoring unit configured to monitor the amplified current amplified and output a monitor signal, and a first bias voltage setting unit configured to gain the monitor signal by a factor less than 1 and apply a reverse bias voltage to the first photoelectric conversion element according to the gained monitor signal.

Further features of the present invention will become apparent from the following description of exemplary embodiments with reference to the attached drawings.

DESCRIPTION OF THE EMBODIMENTS

First Embodiment

Figure 1:
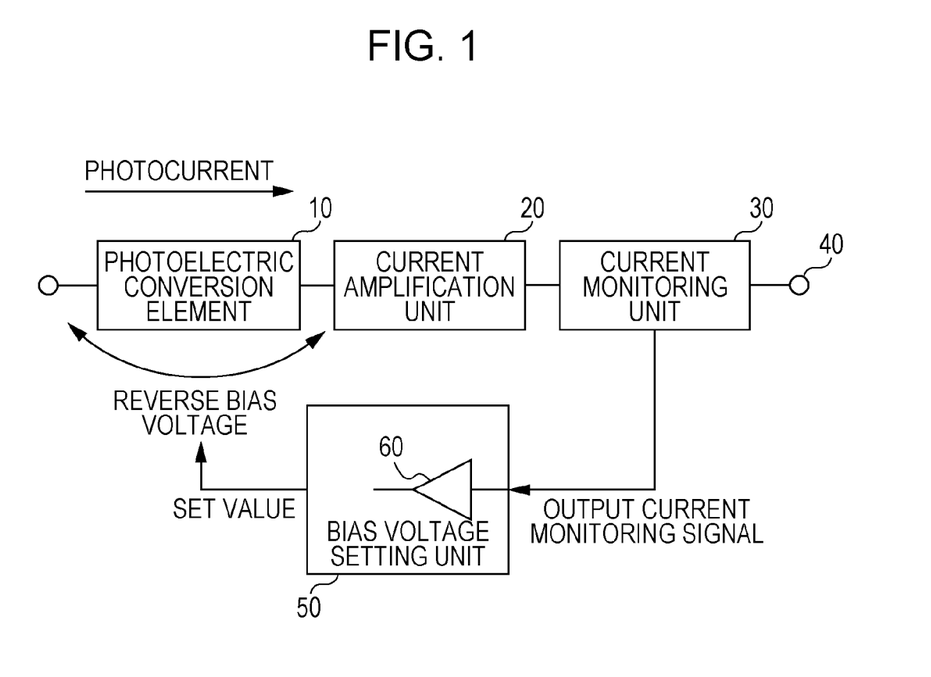
FIG. 1 is a diagram illustrating an example of a configuration of a photoelectric conversion apparatus according to an embodiment of the invention.

FIG. 1 is a schematic diagram illustrating an example of a configuration of a photoelectric conversion apparatus according to a first embodiment of the invention. In FIG. 1, the photoelectric conversion apparatus includes a photoelectric conversion element 10, a current amplification unit 20, a current monitoring unit 30, a current output terminal 40, and a bias voltage setting unit 50. The bias voltage setting unit 50 includes a gain unit 60. The photoelectric conversion element 10 converts incident light into an electric current by photoelectric conversion. The current amplification unit 20 amplifies the converted electric current produced by the photoelectric conversion element 10. The current monitoring unit 30 monitors the current amplified by the current amplification unit 20 and outputs a result as a monitor signal. The current output terminal 40 outputs the output current monitored by the current monitoring unit 30. The gain unit 60 gains the monitor signal provided by the current monitoring unit 30 by a factor less than 1. The signal gain of the gain unit 60 is set to $1/A$ ($A>1$). The bias voltage setting unit 50 applies a reverse bias voltage to the photoelectric conversion element 10 depending on the monitor signal gained by the gain unit 60. If a change occurs in the photocurrent generated in the photoelectric conversion element 10, a corresponding change occurs in the current output by the current amplification unit 20, and thus a change occurs in the current flowing through the current monitoring unit 30. In response, an output current monitor signal is applied to the bias voltage setting unit 50 to adjust the reverse bias voltage applied to the photoelectric conversion element 10. The bias voltage setting unit 50 includes the gain unit 60 with a signal gain of $1/A$ ($A>1$) whereby the change in the reverse bias voltage is suppressed. That is, it is possible to suppress the light-intensity-dependent change in the reverse bias voltage applied to the photoelectric conversion element 10, and thus it is possible to provide a photoelectric conversion apparatus with a good optical response characteristic.

Figure 2:
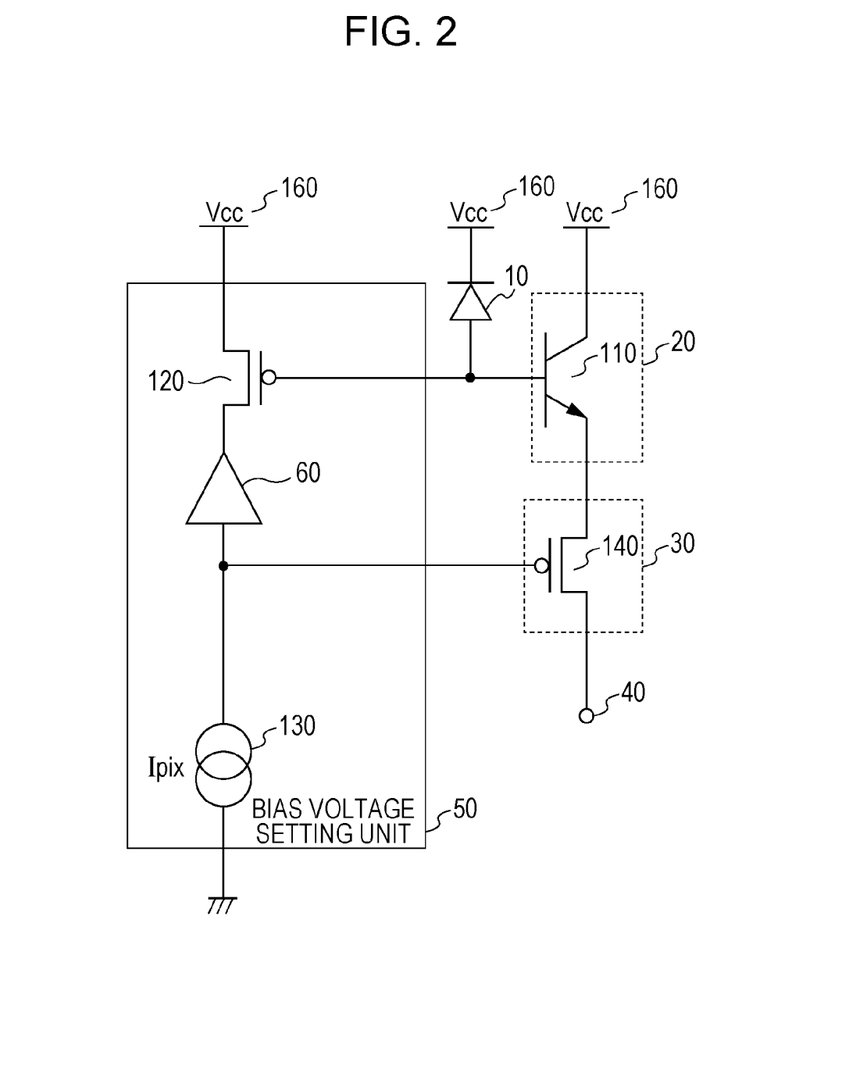
FIG. 2 is a diagram illustrating an example of a configuration of a photoelectric conversion apparatus according to an embodiment of the invention.

FIG. 2 is a circuit diagram illustrating an example of a configuration of the photoelectric conversion apparatus shown in FIG. 1. FIG. 2 corresponds to FIG. 1 as follows. In FIG. 2, an NPN bipolar transistor 110 is used as the current amplification unit 20, and a P-channel MOSFET (first field effect transistor) 140 is used as the current monitoring unit 30. The bias voltage setting unit 50 includes a gain unit 60, a P-channel MOSFET (second field effect transistor) 120, and a constant current source 130. The MOSFET 120 and the MOSFET 140 are the same in polarity (for example, P channel). The constant current source 130 is electrically connected between the drain of the MOSFET 120 and a reference potential (ground potential) terminal. Next, the configuration and the operation of the photoelectric conversion apparatus shown in FIG. 2 are described below. The photoelectric conversion element 10 may be realized, for example, by a phototransistor. A cathode of the photoelectric conversion element 10 is electrically connected to a power supply terminal 160. The power supply terminal 160 receives a power supply voltage $V_{cc}$. The bipolar transistor 110 is electrically connected such that its base thereof is connected to the anode of the photoelectric conversion element 10, its collector is connected to the power supply terminal 160, and its emitter is connected to the source of the MOSFET 140 so that the current flowing through the photoelectric conversion element 10 is amplified and output from the emitter of the bipolar transistor 110. The MOSFET 120 is electrically connected such that its gate is connected to the base of the bipolar transistor 110, its source is connected to the power supply terminal 160, and its drain is connected to an output terminal of the gain unit 60. The drain of the MOSFET 120 receives the monitor signal gained by the gain unit 60. The constant current source 130 is electrically connected between an input terminal of the gain unit 60 and the reference potential terminal so that the MOSFET 120 is driven by the constant current source 130. The MOSFET 120 and the constant current source 130 form a common source circuit. The first MOSFET 140 is electrically connected such that its gate is connected to the constant current source 130, its source is connected to the emitter of the bipolar transistor 110, and its drain is connected to the current output terminal 40 so that the potential at the gate of the first MOSFET 140 is output as a monitor signal. The photocurrent amplified by the bipolar transistor 110 is output from the current output terminal 40. The voltage gain of the gain unit 60 is set to be equal to 1/A (A>1), and its input terminal is electrically connected to the gate of the MOSFET 140 and its output terminal is electrically connected to the drain of the MOSFET 120 so that the monitor signal associated with the MOSFET 140 is gained by the factor less than 1. In FIG. 2, a current $I_{pix}$ flowing through the constant current source 130, that also flows through the MOSFET 120, has a relationship with the gate-source voltage $V_{gs1}$ of the MOSFET 120 as shown below in equation (1).

$$I_{pix} = \frac{\beta}{2}(V_{gs1} - V_{th})^2(1 + \lambda V_{ds1}) \quad (1)$$

In equation (1), $V_{ds1}$ is the voltage between the drain and source of the MOSFET 120, $V_{th}$ is a threshold voltage of the MOSFET 120, and $\lambda$ is a channel length modulation coefficient. $\beta$ is given by an equation (2) shown below.

$$\beta = \mu_0 C_{ox} W/L \quad (2)$$

In equation (2), $\mu_o$ is a carrier mobility, $C_{ox}$ is a gate capacitance per unit area of the MOSFET 120, W is a gate width of the MOSFET 120, and L is a gate length of the MOSFET 120. From equation (1), equation (3) shown below is obtained which expresses $V_{gs1}$.

$$V_{gs1} = V_{th} + \sqrt{\frac{2I_{pix}}{\beta(1 + \lambda V_{ds1})}} \quad (3)$$

The value given by equation (3) is applied as the reverse bias voltage to the photoelectric conversion element 10. When the collector current of the bipolar transistor 110 is denoted by $I_{out}$, $I_{out}$ is given by equation (4) shown below as a function of a base-emitter voltage $V_{be}$.

$$I_{out} = I_s \times \exp(qV_{be}/kT) \quad (4)$$

In equation (4), $I_s$ denotes a saturation current, q denotes an elementary charge, k denotes a Boltzmann constant, and T denotes an absolute temperature. $I_{out}$ is also a function of the gate-source voltage $V_{gs2}$ of the first MOSFET 140 and is given by equation (5) shown below in which $V_{ds2}$ denotes the drain-source voltage of the MOSFET 140.

$$I_{out} = \frac{\beta}{2}(V_{gs2} - V_{th})^2(1 + \lambda V_{ds2}) \quad (5)$$

A benefit achieved by providing the gain unit 60 is described below. When a change occurs in the photocurrent generated in the photoelectric conversion element 10, the changes causes the collector current $I_{out}$ of the bipolar transistor 110 to change, and thus a change occurs in $V_{be}$ and $V_{gs2}$ as can be seen from equations (4) and (5). That is, a change occurs in the gate potential of the first MOSFET 140. If this change in the gate potential of the first MOSFET 140 is denoted by $\Delta V_g$, then the change in the drain-source voltage of the MOSFET 120 is given as $\Delta V_{ds1} = -\Delta V_g/A$. By differentiating equation (3), equation (6) shown below is obtained.

$$\Delta V_{gs1} = -\lambda \sqrt{\frac{I_{pix}}{2\beta}} (1 + \lambda V_{ds})^{-\frac{3}{2}} \Delta V_{ds1} \quad (6)$$

Substituting $\Delta V_{ds1} = -\Delta V_g/A$ into equation (6) yields equation (7) shown below.

$$\Delta V_{gs1} = \lambda \sqrt{\frac{I_{pix}}{2\beta}} (1 + \lambda V_{ds})^{-\frac{3}{2}} \frac{\Delta V_g}{A} \quad (7)$$

From equation (7), it can be seen that the provision of the gain unit 60 leads to a reduction by a factor of 1/A in the change in the reverse bias voltage of the photoelectric conversion element 10. The present embodiment, as described above, makes it possible to suppress the change in the reverse bias voltage applied to the photoelectric conversion element due to a change in the amount of light, and thus it becomes possible to achieve a good optical response characteristic in the photoelectric conversion apparatus.

Second Embodiment

Figure 3:
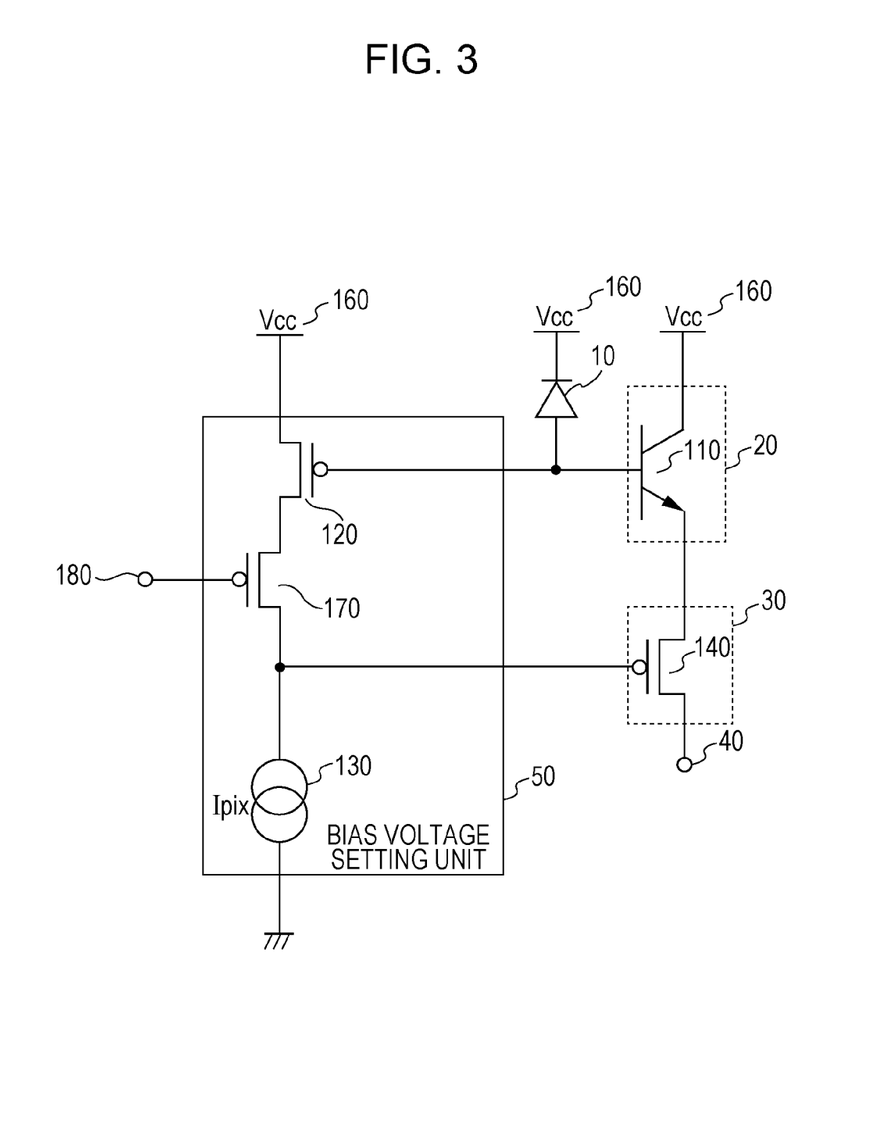
FIG. 3 is a diagram illustrating an example of a configuration of a photoelectric conversion apparatus according to an embodiment of the invention.

FIG. 3 is a circuit diagram illustrating an example of a configuration of a photoelectric conversion apparatus according to a second embodiment of the invention. In the following description, only differences from the first embodiment are explained. The configuration shown in FIG. 3 is different from that shown in FIG. 2 in that the gain unit 60 is realized using a P-channel MOSFET (third field effect transistor) 170. The MOSFET 170 is electrically connected such that its gate is connected to a bias terminal 180 supplied with a constant potential, its source is connected to the drain of the MOSFET 120, and its drain is connected to the gate of the MOSFET 140 and the constant current source 130. Herein, let the transconductance and the output resistance of the MOSFET 170 be respectively denoted by $g_m$ and $r_o$. If a change of $\Delta V_g$ occurs in the gate potential of the first MOSFET 140, a corresponding change $\Delta V_d$ occurs in the drain potential of the MOSFET 120. By nature of the common gate circuit, the change $\Delta V_d$ is given by equation (8) shown below.

$$\Delta V_d \approx \frac{\Delta V_g}{g_m r_0} \quad (8)$$

Thus, in a similar manner to equation (7), equation (9) indicating the change $\Delta V_{gs1}$ in the reverse bias voltage is obtained.

$$\Delta V_{gs1} = \lambda \sqrt{\frac{I_{pix}}{2\beta}} (1 + \lambda V_{ds})^{-\frac{3}{2}} \frac{\Delta V_g}{g_m r_0} \quad (9)$$

As described above, the present embodiment provides a simple configuration that makes it possible to suppress the change in the reverse bias voltage applied to the photoelectric conversion element due to a change in the amount of light, and thus it becomes possible to achieve a good optical response characteristic in the photoelectric conversion apparatus.

Third Embodiment

Figure 4:
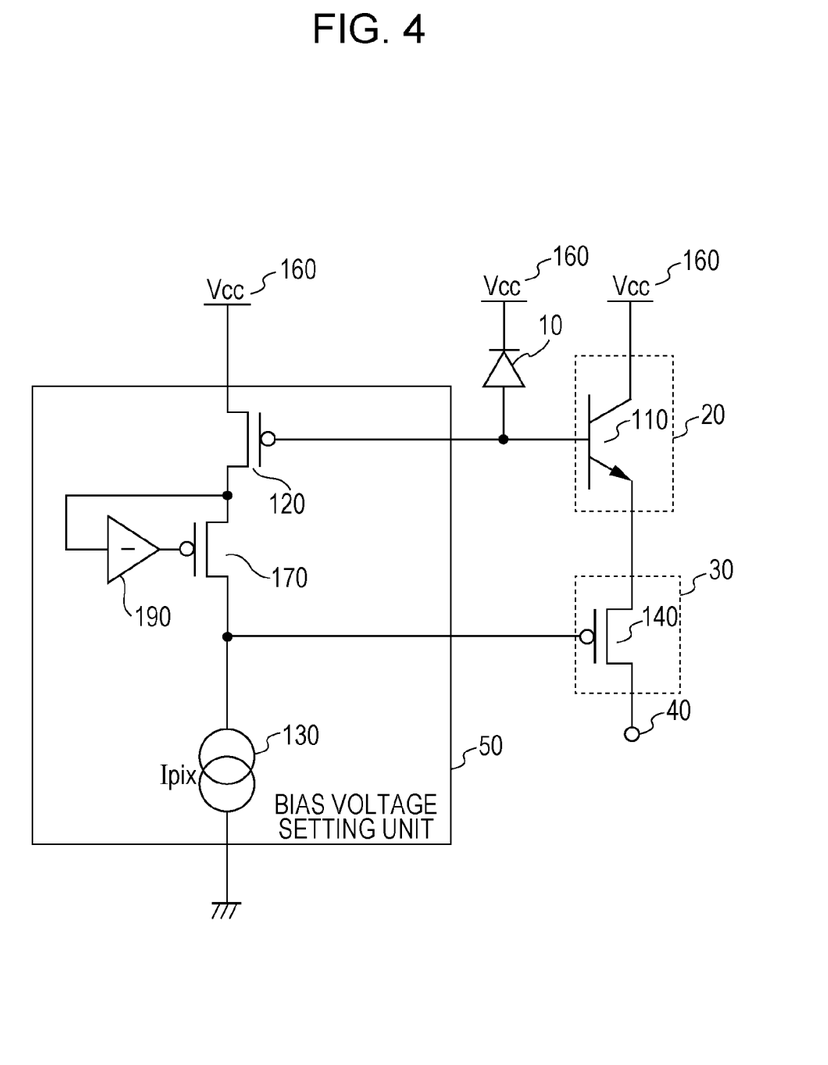
FIG. 4 is a diagram illustrating an example of a configuration of a photoelectric conversion apparatus according to an embodiment of the invention.

FIG. 4 is a circuit diagram illustrating an example of a configuration of a photoelectric conversion apparatus according to a third embodiment of the invention. In the following description, only differences from the second embodiment described above are explained. The configuration shown in FIG. 4 is different from that shown in FIG. 3 in that the gain unit 60 is realized using a combination of a MOSFET 170 and an inverting amplifier 190. The inverting amplifier 190 is electrically connected such that its input terminal is connected to the drain of the MOSFET 120 and its output terminal is connected to the gate of the MOSFET 170 so that an input signal is inverted and amplified and a resultant signal is output. This configuration allows a further suppression in the change in the reverse bias voltage, which leads to a further improvement in the optical response characteristic. Herein, let –B (B>1) denote the voltage gain of the inverting amplifier 190. If the gate potential of the first MOSFET 140 changes by an amount of $\Delta V_g$, a corresponding change $\Delta V_d$ occurs in the drain potential of the MOSFET 120. By nature of the common gate circuit with the additional inverting amplifier 190, the change $\Delta V_d$ is given by equation (10) shown below.

$$\Delta V_{ds} \approx \frac{\Delta V_g}{g_m r_0 \times B} \quad (10)$$

Thus, in a similar manner to equation (7), equation (11) indicating the change $\Delta V_{gs1}$ in the reverse bias voltage is obtained.

$$\Delta V_{gs1} = \lambda \sqrt{\frac{I_{pix}}{2\beta}} (1 + \lambda V_{ds})^{-\frac{3}{2}} \frac{\Delta V_g}{g_m r_0 \times B} \quad (11)$$

As can be seen from a comparison between equations (11) and (9), a further compression of the reverse bias voltage is achieved. The present embodiment, as described above, makes it possible to further suppress the change in the reverse bias voltage applied to the photoelectric conversion element 10 due to a change in the amount of light, and thus it becomes possible to achieve a good optical response characteristic in the photoelectric conversion apparatus.

Fourth Embodiment

Figure 5:
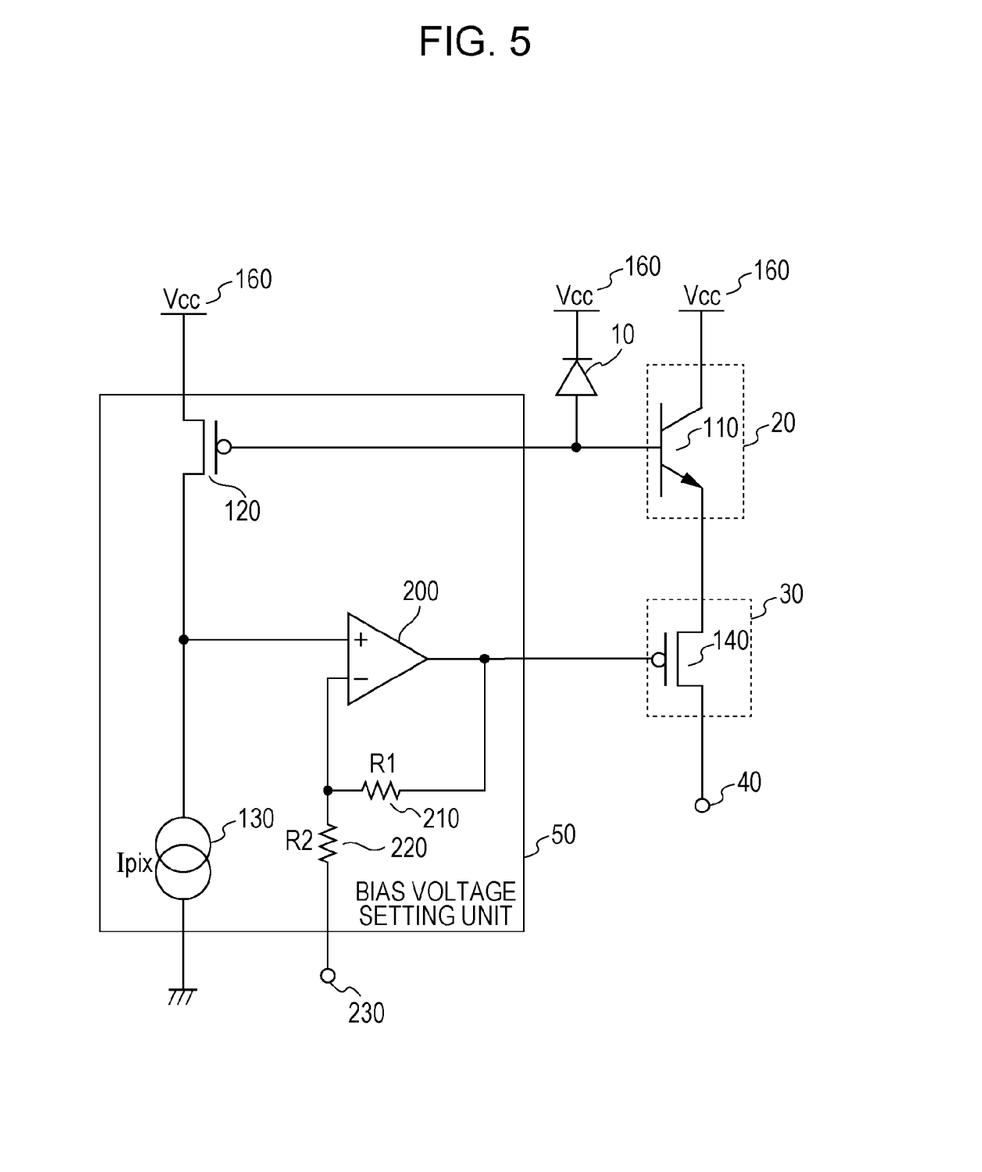
FIG. 5 is a diagram illustrating an example of a configuration of a photoelectric conversion apparatus according to an embodiment of the invention.

FIG. 5 is a circuit diagram illustrating an example of a configuration of a photoelectric conversion apparatus according to a fourth embodiment of the invention. In the following description, only differences from the second embodiment described above are explained. The configuration shown in FIG. 5 is different from that shown in FIG. 3 in that the gain unit 60 is realized using a combination of an operational amplifier 200, a first resistor element 210, and a second resistor element 220. The drain of the MOSFET 120 is electrically connected to the reference potential terminal via the constant current source 130. The operational amplifier 200 is electrically connected such that its non-inverting input terminal is connected to the drain of the MOSFET 120, its inverting input terminal is connected to a constant voltage terminal 230 via the second resistor element 220, and its output terminal is connected to the gate of the MOSFET 140. The first resistor element 210 is electrically connected between the gate of the MOSFET 140 and the inverting input terminal of the operational amplifier 200. The second resistor element 220 is electrically connected to the inverting input terminal of the operational amplifier 200 and the constant voltage terminal 230. The first resistor element 210 has a resistance of R1, and the second resistor element 220 has a resistance of R2. This configuration allows not only a suppression of the change in the reverse bias voltage but also a suppression of an influence of process variations. In FIG. 5, one end of the second resistor element 220 is electrically connected to the constant voltage terminal 230. In FIG. 5, the change $\Delta V_g$ in the gate potential of the first MOSFET 140 is given by equation (12) as a function of the change $\Delta V_d$ of the drain potential of the MOSFET 120 as shown below.

$$\Delta V_g = \left(1 + \frac{R_1}{R_2}\right) \Delta V_d \quad (12)$$

Thus, when the gate potential of the first MOSFET 140 changes by an amount of $\Delta V_g$, if it is assumed that R1/R2>>1, then equation (13) shown below is obtained.

$$\Delta V_d = \frac{R_2}{R_1} \Delta V_g \quad (13)$$

Thus, in a similar manner to (7), equation (14) indicating the change $\Delta V_{gs1}$ in the reverse bias voltage is obtained.

$$\Delta V_{gs1} = \lambda \sqrt{\frac{I_{pix}}{2\beta}} (1 + \lambda V_{ds})^{-\frac{3}{2}} \frac{\Delta V_g}{\frac{R_1}{R_2}} \qquad (14)$$

As can be seen from comparison between equation (14) and equation (9), $g_m \cdot r_o$ in the denominator in equation (9) is replaced by $R_1/R_2$ in equation (14). In the second and third embodiments described above, a variation in the current of the current source 130 or characteristics of the MOSFET 170 due to a process variation may result in a variation in $g_m$ or $r_o$. That is, in the second and third embodiments, as can be seen from equation (9), the change in the reverse bias voltage is influenced by the process variation, and thus the optical response characteristic tends to be sensitive to the process variation. In contrast, in the present embodiment, as can be seen from equation (14), the process variation can cause the both $R_1$ and $R_2$ to change by the same ratio, and thus it is expected that effects of changes in $R_1$ and $R_2$ are cancelled out. In the present embodiment, as described above, not only the change in the reverse bias voltage applied to the photoelectric conversion element due to the change in the amount of light is suppressed, the influence of process variations is also suppressed. Thus, it is possible to provide a photoelectric conversion apparatus that has a good optical response characteristic without being influenced by process variations.

Fifth Embodiment

Figure 6:
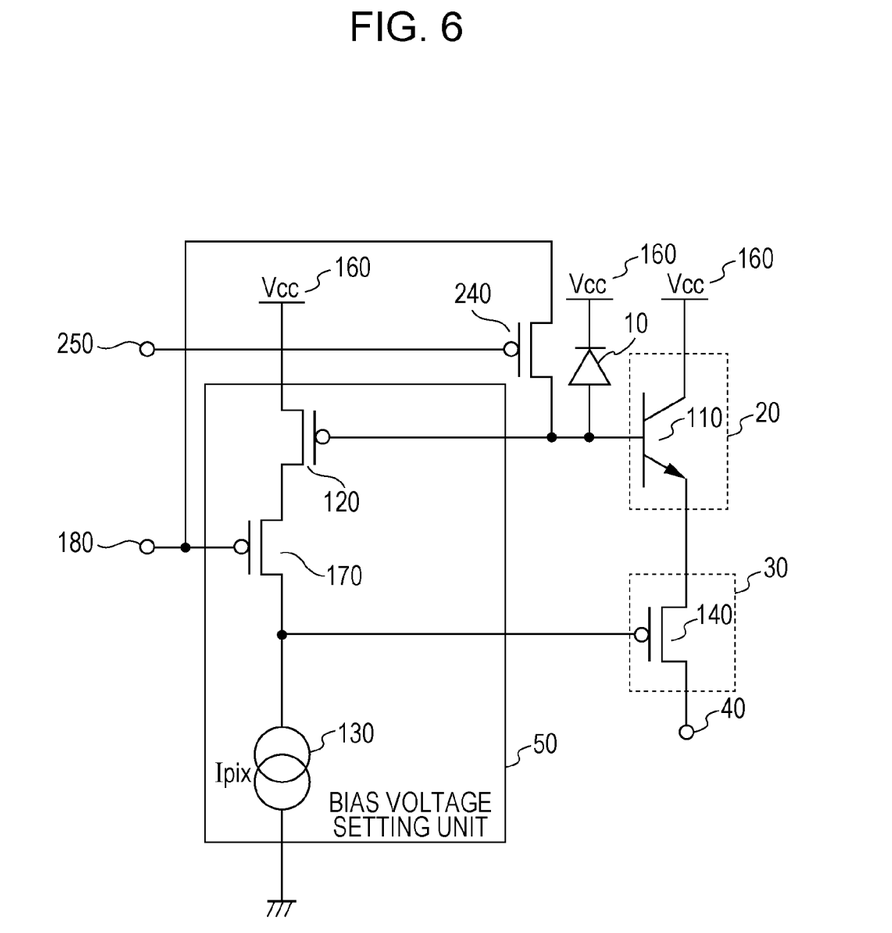
FIG. 6 a diagram illustrating an example of a configuration of a photoelectric conversion apparatus according to an embodiment of the invention.

FIG. 6 is a circuit diagram illustrating an example of a configuration of a photoelectric conversion apparatus according to a fifth embodiment of the invention. In the following description, only differences from the second embodiment described above are explained. The configuration shown in FIG. 6 is different from that shown in FIG. 3 in that there is an additional P-channel MOSFET (fourth field effect transistor) 240 whose source is electrically connected together with the gate of the MOSFET 170 to a bias terminal 180 such that the bias terminal 180 is shared to provide both the source bias voltage of the MOSFET 240 and the gate bias voltage of the MOSFET 170. The MOSFET 240 is electrically connected such that its drain is connected to the base of the bipolar transistor 110, its gate is connected to a reset signal input terminal 250, and its source is connected to the gate of the MOSFET 170 and a bias terminal 180. In this configuration, the change in the reverse bias voltage of the photoelectric conversion element 10 due to the change in the amount of light is suppressed, thereby achieving an improvement in the optical response characteristic. Furthermore, in this configuration, the sharing of the bias voltage control line associated with the bias terminal 180 allows a reduction in space. A reason for the provision of the MOSFET 240 is that, for example, when electric power is turned on, i.e., when the power supply voltage is applied and thus the base potential of the bipolar transistor 110 is raised from 0 V to the power supply voltage, the provision of the MOSFET 240 allows the base potential of the bipolar transistor 110 to quickly rise. In a case where there is no MOSFET 240, the base potential is raised to a particular constant value by charging a parasitic capacitance associated with the bipolar transistor 110 by a photocurrent generated in the photoelectric conversion element 10. However, in a dark circumstance, the photocurrent is low, and thus it takes a very long time to raise the base potential. In the present embodiment, to avoid the above situation, a low-level signal is input to the reset signal input terminal 250 to quickly raise the base potential. The base potential reset voltage may be set to be equal to the particular constant value (i.e., $V_{cc}$) of the base potential minus $V_{gs1}$ given by equation (3). In FIG. 6, the voltage $V_{bias}$ applied to the bias terminal 180 is set to satisfy a condition represented by equation (15) shown below.

$$V_{bias} \approx V_{cc} - \left\{ V_{th1} + \sqrt{\frac{2I_{pix}}{\beta_1(1 + \lambda V_{ds1})}} \right\} \qquad (15)$$

In equation (15), $V_{th1}$ and $\beta_1$ respectively denote $V_{th}$ and $\beta$ of the MOSFET 120. The MOSFET 120 forming the common source circuit is to operate in a saturation region. To satisfy this requirement, the gate bias voltage $V_{bias}$ of the MOSFET 170 is set so as to satisfy equation (16) shown below.

$$V_{bias} \leq V_{cc} - \left\{ V_{th3} + \sqrt{\frac{2I_{pix}}{\beta_1(1 + \lambda V_{ds1})}} + \sqrt{\frac{2I_{pix}}{\beta_3(1 + \lambda V_{ds3})}} \right\} \qquad (16)$$

In equation (16), $V_{th3}$ and $\beta_3$ respectively denote $V_{th}$ and $\beta$ of the MOSFET 170. From equations (15) and (16), equation (17) shown below is obtained. Thus, as shown in FIG. 6, it is possible to share the bias voltage for both the source bias voltage of the MOSFET 240 and the gate bias voltage of the MOSFET 170.

$$V_{th3} + \sqrt{\frac{2I_{pix}}{\beta_3(1 + V_{ds3})}} \leq V_{th1} \qquad (17)$$

In the present embodiment, as described above, the change in the reverse bias voltage of the photoelectric conversion element 10 due to the change in the amount of light is suppressed, and an improvement in the optical response characteristic is achieved. Furthermore, in this configuration, the function of shortening the transient period that occurs when the electric power is turned on can be realized in a small space by sharing the bias voltage control line.

Sixth Embodiment

Figure 7:
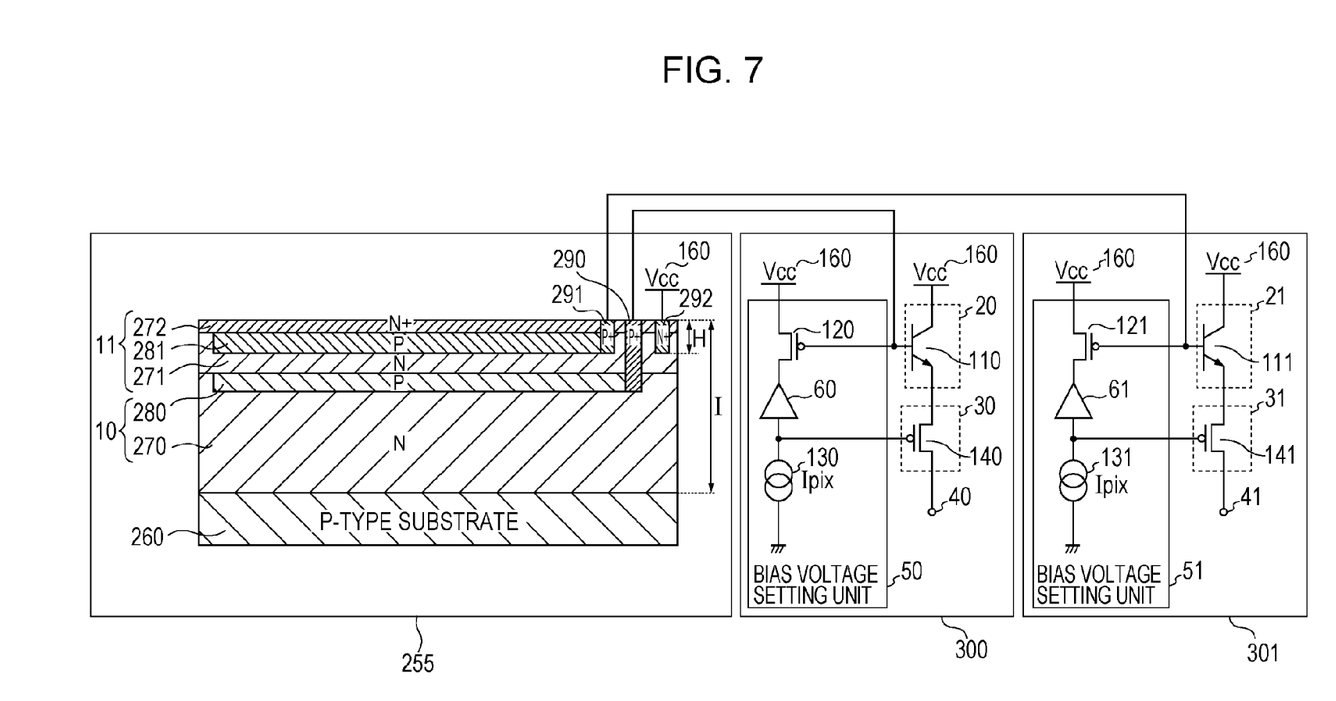
FIG. 7 is a diagram illustrating an example of a configuration of a photoelectric conversion apparatus according to an embodiment of the invention.

FIG. 7 is a circuit diagram illustrating an example of a configuration of a photoelectric conversion apparatus according to a sixth embodiment of the invention. In the following description, only differences from the first embodiment are explained. A photoelectric conversion unit 255 includes an N-type region 270, a P-type region 280, an N-type region 271, a P-type region 281, and a surface N+ region 272, which are formed on a P-type silicon substrate 260 such that N-type regions and P-type regions are alternately formed in a one-on-another fashion. Note that the P-type regions 280 and 281 are located at different depths. Light incident on the silicon semiconductor layers penetrates the silicon semiconductor layers such that light with greater wavelength reaches greater depths, and thus P-type regions 280 and 281 provide signals for different wavelength bands of light. A first photoelectric conversion element 10 includes the N-type region 270, the P-type region 280, and the N-type region 271, while a second photoelectric conversion element 11 includes the N-type region 271, the P-type region 281, and the surface N+ region 272. The photoelectric conversion elements 10 and 11 are located adjacent to each other in a depth direction. The N-type region 270, the P-type region 280, the N-type region 271, the P-type region 281, and the N-type region 272 respectively serve as a first N-type region, a first P-type region, a second N-type region, a second P-type region, and third N-type region, which are disposed in a one-on-another fashion. Thus, the first photoelectric conversion element 10 includes the first N-type region 270, the first P-type region 280, and the second N-type region 271, while the second photoelectric conversion element 11 includes the second N-type region 271, the second P-type region 281, and the third N-type region 272.

In the circuit shown in FIG. 7, contact parts 290 and 291 are respectively provided on the P-type regions 280 and 281, and photocurrents generated in the respective photoelectric conversion elements 10 and 11 are read out via the contact parts 290 and 291 respectively. A first reading circuit 300 and a second reading circuit 301 are respectively provided for the first photoelectric conversion element 10 and the second photoelectric conversion element 11. The first reading circuit 300 and the second reading circuit 301 respectively include a first bipolar transistor 110 and a second bipolar transistor 111 that respectively function as a first current amplification unit 20 and a second current amplification unit 21. There are also provided P-channel MOSFETs 140 and 141 respectively serving as a first current monitoring unit 30 and a second current monitoring unit 31. Furthermore, there are provided a first bias voltage setting unit 50, a second bias voltage setting unit 51, a first current output terminal 40, and a second current output terminal 41. The first bias voltage setting unit 50 includes a P-channel MOSFET 120, a first gain unit 60, and a first constant current source 130. The second bias voltage setting unit 51 includes a P-channel MOSFET 121, a second gain unit 61, and a second constant current source 131. In FIG. 7, an N-type contact part 292 is formed in the N-type region 271 and the surface N+-type region 272 and is electrically connected to a power supply terminal 160. In FIG. 7, as described above, the reading circuits 300 and 301 are respectively provided for the photoelectric conversion elements 10 and 11, and the reading circuits 300 and 301 respectively have the gain units 60 and 61. In FIG. 7, the gain units 60 and 61 are configured to be optimum for the respective photoelectric conversion elements 10 and 11 so that changes in reverse bias voltages applied to the respective photoelectric conversion elements 10 and 11 due to a change in the amount of light are suppressed to improve the optical response characteristic while achieving a reduction in space. The second photoelectric conversion element 11 is configured in a similar manner to the first photoelectric conversion element 10 to convert light into a current by a photoelectric conversion. The second current amplification unit 21 is configured in a similar manner to the first current amplification unit 20 to amplify the current produced by the second photoelectric conversion element 11 by the conversion. The second current monitoring unit 31 is configured in a similar manner to the first current monitoring unit 30 to monitor the current amplified by the second current amplification unit 21 and output a result as a monitor signal. The second bias voltage setting unit 51 is configured in a similar manner to the first bias voltage setting unit 50 to apply a reverse bias voltage to the second photoelectric conversion element 11 according to the monitor signal provided by the second current monitoring unit 31.

Figure 8:
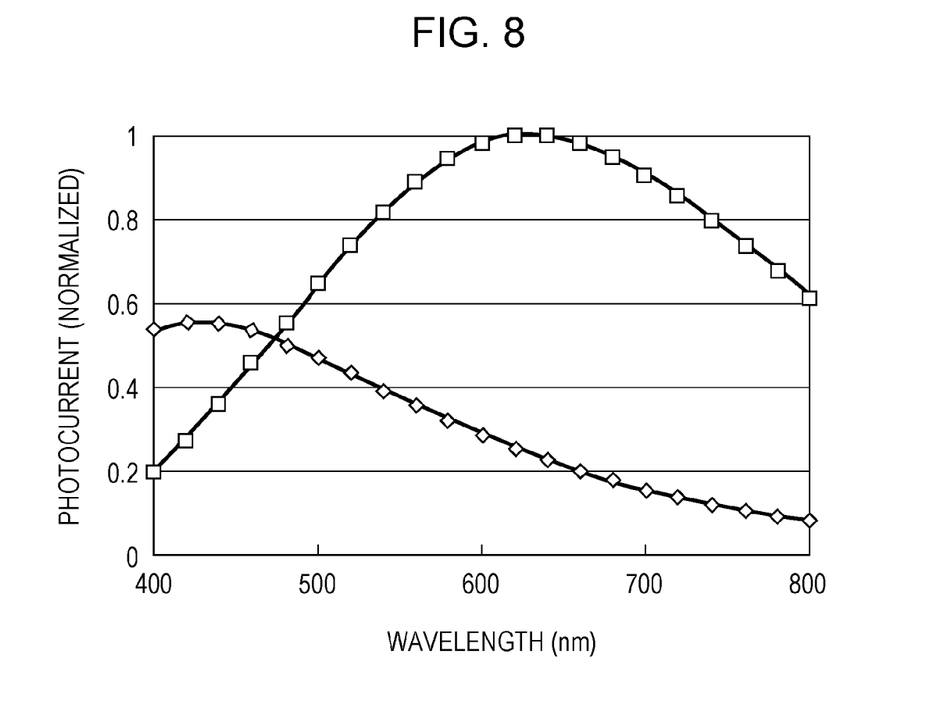
FIG. 8 is a diagram illustrating a result of a simulation on a spectral characteristic of the photoelectric conversion apparatus shown in FIG. 7.

In FIG. 7, H denotes a depth at which the N-type region 271 has a peak of an impurity profile, and I denotes a total thickness of a semiconductor layer formed on the P-type substrate 260. In FIG. 7, spectral characteristics of the photoelectric conversion elements 10 and 11 are determined chiefly by these two factors H and I. FIG. 8 illustrates simulated spectral characteristics for a case where H and I are respectively set to, by way of example, 0.4 µm and 4.5 µm. In FIG. 8, a horizontal axis represents a wavelength of incident light, and a vertical axis represents photocurrents obtained from the photoelectric conversion elements 10 and 11. A curve having a peak at a wavelength of about 400 nm indicates a characteristic of the photoelectric conversion element 11 while a curve having a peak at a wavelength of about 600 nm indicates a characteristic of the photoelectric conversion element 10. When the photoelectric conversion elements 10 and 11 have the spectral characteristics shown in FIG. 8 or similar spectral characteristics, the photoelectric conversion element 10 provides a greater photocurrent for most light sources with various spectral characteristics than the photoelectric conversion element 11 can provide. This means that the photoelectric conversion element 10 has a great ability to suppress the time spent to charge the parasitic capacitance associated with the base of the bipolar transistor 110, and thus the photoelectric conversion element 10 has a good optical response characteristic. Therefore, from equation (6), it can be concluded that even if the voltage gain of the gain unit 60 for the photoelectric conversion element 10 is set to be greater than the voltage gain of the gain unit 61 for the photoelectric conversion element 11, the photoelectric conversion element 10 can have an optical response characteristic similar to that of the photoelectric conversion element 11. Thus, in FIG. 7, the gain unit 61 may be configured to be similar to that according to the third embodiment described above, while the gain unit 60 may be configured to be similar to that according to the second embodiment described above. Furthermore, in FIG. 7, the gain unit 60 may be removed while preserving the gain unit 61. The first bias voltage setting unit 50 includes a first gain unit 60 that gains the monitor signal provided by the first current monitoring unit 30 by a factor less than 1. The second bias voltage setting unit 51 includes a second gain unit 61 that gains the monitor signal provided by the second current monitoring unit 31 by a factor less than 1. The second bias voltage setting unit 51 applies a reverse bias voltage to the second photoelectric conversion element 11 according to the monitor signal gained by the second gain unit 61. Note that the photoelectric conversion apparatus may include both gain units 60 and 61 or only one of these gain units. In the present embodiment, as described above, changes in reverse bias voltages applied to the respective photoelectric conversion elements 10 and 11 due to a change in the amount of light are suppressed to improve the optical response characteristic while achieving a reduction in space.

In the first to sixth embodiments described above, it is assumed by way of example that the photoelectric conversion elements 10 and 11 are of a type in which holes are accumulated and the NPN bipolar transistors are used as the current amplification units 20 and 21. However, the elements or units are not limited to those types employed in the embodiments described above. For example, the photoelectric conversion elements 10 and 11 may be of a type in which electrons are accumulated, and PNP bipolar transistors may be used as the current amplification units 20 and 21. These elements may be used to achieve a similar configuration to obtain similar effects.

In the first to sixth embodiments described above, it is also assumed by way of example that the photoelectric conversion apparatus includes a single gain unit 60. However, there is no particular restriction on the number of gain units and the photoelectric conversion apparatus may include a plurality of gain units. For example, the photoelectric conversion apparatus may include both a gain unit similar to the gain unit 60 according to the second embodiment and a gain unit similar to the gain unit 60 according to the fourth embodiment.

In the second, third, and fifth embodiments described above, it is assumed by way of example that the common-gate P-channel MOSFET 170 is employed as the gain unit 60. However, other types of devices may be used as the gain unit 60. For example, a common-base PNP bipolar transistor may be used to achieve a similar effect.

In the sixth embodiment described above, it is assumed by way of example that the photoelectric conversion apparatus includes two photoelectric conversion elements formed so as to be located adjacent to each other in the depth direction. However, the number of photoelectric conversion elements is not limited to two. Although it is also assumed that the photoelectric conversion element located at a greater depth with respect to the surface provides a greater photocurrent than the other one can provide, photoelectric conversion elements may be configured differently.

Note that the embodiments of the present invention have been described by way of examples but not by way of limitation. It will be obvious that various changes may be made without departing from the spirit or characteristics of the present invention. In the present description, the expression "being electrically connected" is used to describe "being connected directly or indirectly via a switch to something." The switch may be replaced with another type of electric element as along as a circuit operation substantially the same as that disclosed above is achieved.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2010-050767 filed Mar. 8, 2010, which is hereby incorporated by reference herein in its entirety.

What is claimed is:

1. An apparatus comprising:
   a first photoelectric conversion element configured to convert light into a first current by a photoelectric conversion;
   a first current amplification unit configured to amplify the first current;
   a first current monitoring unit configured to monitor the amplified first current and output a first monitor signal; and
   a first bias voltage setting unit configured to gain the monitor signal by a factor less than 1 and apply a reverse bias voltage to the first photoelectric conversion element according to the gained monitor signal.

2. The apparatus according to claim 1, wherein:
   the first current amplification unit includes a first bipolar transistor configured such that a base of the first bipolar transistor is electrically connected to an anode of the first photoelectric conversion element, a collector of the first bipolar transistor is electrically connected to a power supply terminal, and the amplified first current is output from an emitter of the first bipolar transistor;
   the first current monitoring unit includes a first field effect transistor (FET) configured such that a source of the first FET is electrically connected to the emitter of the first bipolar transistor, a drain of the first FET is electrically connected to an output terminal, and a potential of a gate of the first FET is output as the monitor signal; and
   the first bias voltage setting unit includes a first gain unit, a second FET, and a first current source.

3. The apparatus according to claim 2, wherein the first gain unit is configured to gain the monitor signal by a factor less than 1, the second FET is configured such that the second FET is same in polarity as the first FET, a source of the second FET is electrically connected to the power supply terminal, a gate of the second FET is electrically connected to the base of the first bipolar transistor, and a drain of the second FET receives the monitor signal gained by the first gain unit, the first current source is electrically connected between the drain of the second FET and a reference potential terminal.

4. The apparatus according to claim 3, wherein the first gain unit includes a third FET configured such that a gate of the third FET is electrically connected to a constant potential bias terminal, a source of the third FET is electrically connected to the drain of the second FET, and a drain of the third FET is electrically connected to the gate of the first FET.

5. The apparatus according to claim 3, wherein the first gain unit includes:
   a third FET configured such that a source of the third FET is electrically connected to the drain of the second FET and a drain of the third FET is electrically connected to the gate of the first FET; and
   an inverting amplifier configured such that an input terminal of the inverting amplifier is electrically connected to the drain of the second FET and an output terminal of the inverting amplifier is electrically connected to the gate of the third FET.

6. The apparatus according to claim 3, wherein the first gain unit includes:
   an operational amplifier configured such that a non-inverting input terminal of the operational amplifier is electrically connected to the drain of the second FET and an output terminal of the operational amplifier is electrically connected to the gate of the first FET;
   a first resistor element connected between the gate of the first FET and an inverting input terminal of the operational amplifier; and
   a second resistor element electrically connected between the inverting input terminal of the operational amplifier and a constant voltage terminal.

7. The apparatus according to claim 4, further comprising a fourth FET configured such that a drain of the fourth FET is electrically connected to the base of the first bipolar transistor, a source of the fourth FET is electrically connected to the gate of the third FET, and a gate of the fourth FET is electrically connected to a reset signal input terminal.

8. The apparatus according to claim 1, further comprising:
   a second photoelectric conversion element configured to convert light into a second current;
   a second current amplification unit configured to amplify the second current by the conversion;
   a second current monitoring unit configured to monitor the amplified second current and output a second monitor signal; and
   a second bias voltage setting unit configured to apply a reverse bias voltage to the second photoelectric conversion element according to the second monitor signal.

9. The apparatus according to claim 8, further comprising:
   regions formed in a multilayer structure including a first N-type region, a first P-type region, a second N-type region, a second P-type region, and a third N-type region,
   wherein the first photoelectric conversion element includes the first N-type region, the first P-type region, and the second N-type region, and the second photoelectric conversion element includes the second N-type region, the second P-type region, and the third N-type region.

10. The apparatus according to claim 9, wherein the first bias voltage setting unit includes a first gain unit configured to gain the first monitor signal by a factor less than 1.

11. The apparatus according to claim 10, wherein the second bias voltage setting unit includes a second gain unit configured to gain the second monitor signal by a factor less than 1, and the second bias voltage setting unit applies the reverse bias voltage to the second photoelectric conversion element according to the gained second monitor signal.

12. An apparatus comprising:
a bipolar transistor functioning as a phototransistor;
a first field effect transistor (FET); and
a second FET with same polarity as that of the first FET,
the bipolar transistor being configured such that an emitter of the bipolar transistor is electrically connected to a source of the first FET, and a base of the bipolar transistor is electrically connected to a gate of the second FET,
the apparatus further comprising:
a gain unit configured such that a gate of the first FET is electrically connected to a drain of the second FET via the gain unit; and
a current source configured to supply a current to the gain unit.

* * * * *